US010782328B2

(12) United States Patent
Abubakari et al.

(10) Patent No.: US 10,782,328 B2
(45) Date of Patent: Sep. 22, 2020

(54) CONFIGURATION OF TESTING MODES IN SUBSTATION DEVICES

(71) Applicant: Schweitzer Engineering Laboratories, Inc., Pullman, WA (US)

(72) Inventors: Hamza Abubakari, Pullman, WA (US); Tovah Whitesell, Pullman, WA (US); Manodev J. Rajasekaran, Pullman, WA (US); Cody Browne, Moscow, ID (US); Gabriel DeRuwe, Moscow, ID (US); David J. Dolezilek, Pullman, WA (US); Karen S J Wyszczelski, Holland, MI (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 160 days.

(21) Appl. No.: 16/124,600

(22) Filed: Sep. 7, 2018

(65) Prior Publication Data

US 2020/0081041 A1 Mar. 12, 2020

(51) Int. Cl.
*G01R 21/133* (2006.01)
*G01R 35/00* (2006.01)
*H02J 13/00* (2006.01)

(52) U.S. Cl.
CPC ......... *G01R 21/133* (2013.01); *G01R 35/005* (2013.01); *H02J 13/0006* (2013.01)

(58) Field of Classification Search
CPC .. G01R 21/133; G01R 35/005; H02J 13/0006
See application file for complete search history.

(56) References Cited

U.S. PATENT DOCUMENTS

| 9,450,407 B2 * | 9/2016 | Kulathu ............ H02J 13/00034 |
| 10,012,681 B2 | 7/2018 | Wimmer |
| 2002/0173927 A1 | 11/2002 | Vandiver |

OTHER PUBLICATIONS

Vizimax, Analog Merging Unit—AMU, 2019. retrieved from https://www.vizimax.com/products-services/merging-units.
GE Multilin Inc., L90 Line Current Differential System, Instruction Manual for Version 7.6x, Jun. 2017, Section 5.11.1.
ABB, Relion® 670 Series Transformer Protection RET670 Version 2.2 IEC, Application Manual, Mar. 2018, Section 24.12.1.1.

* cited by examiner

*Primary Examiner* — Farhana A Hoque
(74) *Attorney, Agent, or Firm* — Richard M. Edge

(57) ABSTRACT

A single point to modify a behavior of intelligent electronic devices (IEDs) between active and testing modes is disclosed herein. The IED may include a variety of logical nodes, each with a behavior object related to the active or testing mode behavior of the IED. A single testing mode selection point of the IED is used to modify each of the logical nodes to change between active and testing modes. The testing mode selection point may be a logical input. The testing mode selection point may be a physical switch on the IED.

20 Claims, 6 Drawing Sheets

CONFIGURATION OF TESTING MODES IN SUBSTATION DEVICES

RELATED APPLICATION (none)

TECHNICAL FIELD

This disclosure relates to changing configuration of substation devices for monitoring electric power delivery systems. More particularly, this disclosure relates to electric power system monitoring devices configurable between active mode and testing modes upon receipt of a single instruction, wherein configuration includes updating behavior of logical nodes of the monitoring device.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
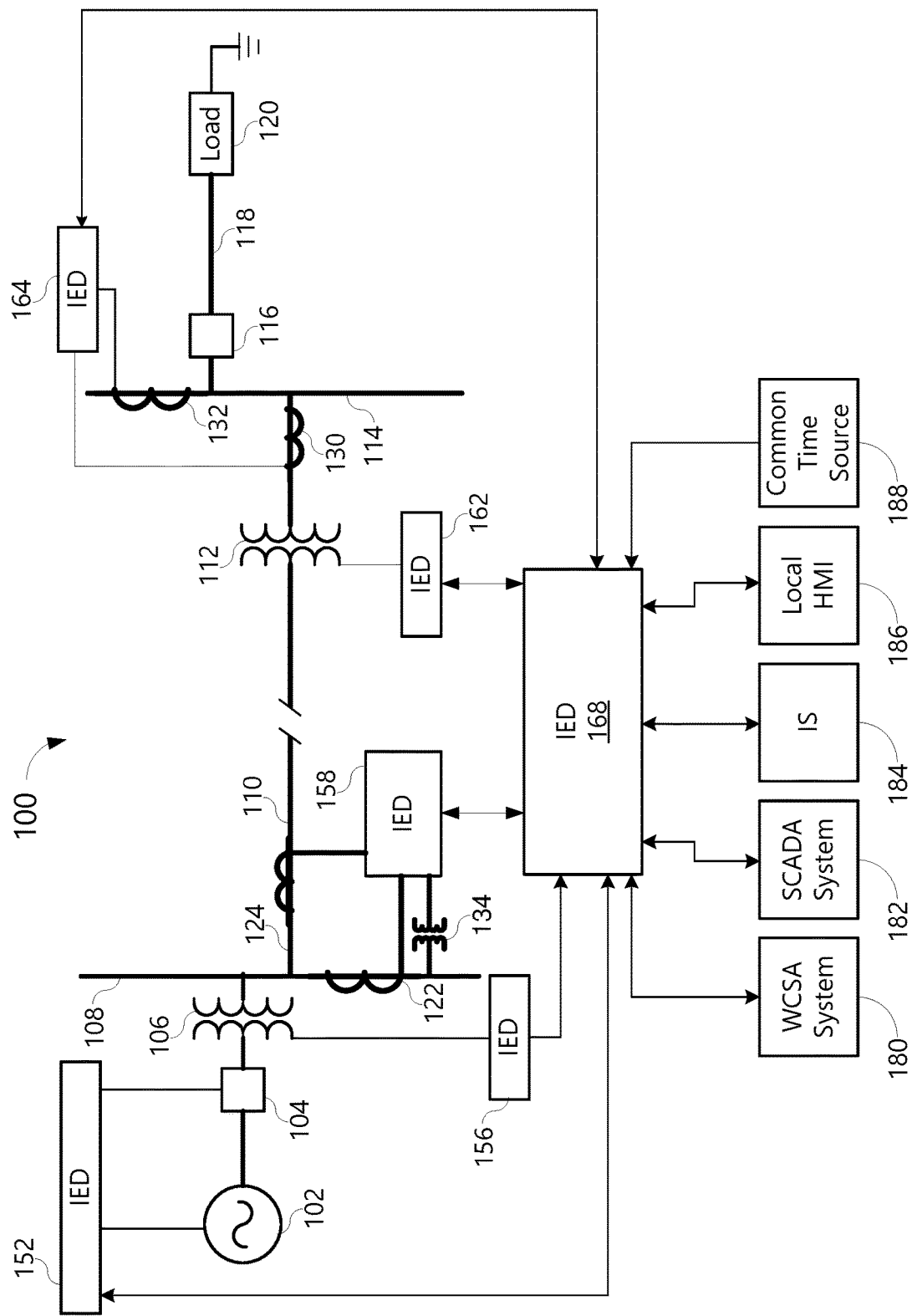
FIG. 1 is a simplified one-line diagram of an electric power delivery system.

Process equipment is often monitored using monitoring devices that are configured to obtain information from the process equipment, perform monitoring routines, and, depending on the outcome of the monitoring routines, ultimately effect a monitoring operation on the process equipment. Such monitoring device may be configured to communicate in order to perform the monitoring routines and effect the monitoring operation. Monitoring devices have been developed according to interoperability standards in order to facilitate interoperability of monitoring devices from different manufacturers of such devices. For example, the International Electrotechnical Commission has published the standard IEC-61850 for defining communication protocols among intelligent electronic devices (IEDs) for electric power delivery systems.

Generally, monitoring devices may be configured with certain logical nodes that effect functioning of the associated logical device or physical device. That is, certain information needed for defined functions may be grouped or labeled as logical nodes within a logical or physical device such as a monitoring device configured to monitor process equipment. The logical nodes may be used to perform monitoring routines, and the information they produce may be communicated among devices.

At various stages in the commissioning, auditing, testing, operation, modification, and updating monitoring devices, operators may have a need for testing certain functions of the monitoring devices. That is, operators may have a need to test the communication configuration or capabilities, the protection configuration, monitoring configuration, automation configuration, as well as interoperability of the monitoring devices. Often, monitoring devices include various settings, inputs, routines, and outputs that must be configured. Testing may include supplying of test signals to the monitoring devices and reading outputs from the monitoring devices or system of monitoring devices to verify that configuration of the monitoring devices is acceptable.

The monitoring devices may be in communication with primary equipment to obtain information from the primary equipment and control operations of the primary equipment. The monitoring devices may also be in communication with each other or with a supervisory system (such as, for example, a supervisory control and data acquisition (SCADA) system). Because monitoring routines of the monitoring devices may effect operation of the primary system or other devices, when testing is performed the various devices under test should be placed into a mode of operation under which the testing will not result in operation of the primary equipment.

In accordance with certain protocols, to place a monitoring device into a testing mode, each logical node of the device subject to the test should have a behavior modified to coordinate with testing mode. As monitoring devices may have many logical nodes, reconfiguring monitoring devices to testing mode may require extensive time and expertise to modify behavior of each of the logical nodes. Such reconfiguration may be not only time consuming and complex, but may result in errors during the migration from active mode to testing mode and during the migration from testing mode back to an active mode. What is needed is a system for modifying the logical nodes to testing mode in a simple, fast, and secure manner, so as to result in fewer errors during reconfiguration, and for timely reconfiguration for testing.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor executable instructions.

FIG. 1 illustrates a simplified one-line diagram of an electric power delivery system 100 monitored by a number of monitoring devices in the form of intelligent electronic devices ("IEDs"). Although a simplified one-line diagram is illustrated, it is understood that the IEDs may be used to monitor a variety of different configurations of electric power delivery systems of single or multiple phases. The electric power delivery system includes a generator 102 for generating electric power at a generation voltage level, which may be transformed to transmission level by transformer 106. Circuit breaker 104 may be operable to connect and disconnect the generator from the transformer 106. The transformer 106 may be in electrical communication with a transmission bus 108 for transmission on line 110. Transformer 112 may be used to transform the electric power from line 110 to distribution levels, for distribution to loads 120 via distribution bus 114 and feeder 118. Circuit breaker 116 may be operable to connect and disconnect electric power to load 120.

As suggested above, the electric power delivery system 100 may be monitored using various IEDs. In particular, IED 152 may be configured to obtain information from generator 102, perform monitoring routines using that information, and effect an operation on the electric power delivery system by signaling circuit breaker 104 to open or close, thus connecting or disconnecting generator 102 and the remainder of the electric power delivery system. IED 156 may be configured to obtain information from transformer 106, perform monitoring routines using the information, and effect an operation on the electric power delivery system via communications with other IEDs operable to signal primary equipment to perform operations on the electric power delivery system. IED 162 may be configured to obtain information from transformer 112, and perform monitoring routines using the information, and effect an operation on the electric power delivery system via communications with other IEDs operable to signal primary equipment to perform operations on the electric power delivery system.

IED 158 may be configured to obtain information from both bus 108 and from transmission line 110 using sensors such as, for example, current transformers 122, 124, potential transformers (PTs), or the like. IED 158 may perform monitoring routines using the information, and effect an operation on the electric power delivery system via communications with other IEDs operable to signal primary equipment to perform operations on the electric power delivery system. Similarly, IED 164 may be configured to obtain information from both bus 114 and from transmission line 110 using sensors such as, for example, current transformers 132, 130, potential transformers (PTs), or the like. IED 164 may perform monitoring routines using the information, and effect an operation on the electric power delivery system via communications with other IEDs operable to signal primary equipment to perform operations on the electric power delivery system.

One or more IEDs may be in communication. As illustrated, each IED is in communication with IED 168 in a star configuration. Different communication topologies may be used such as, for example, ring communication topology, direct peer-to-peer communications, and the like. IED 168 may receive information from other IEDs including, for example, information about the primary equipment, results of monitoring routines, commands for effecting an operation, and the like. IED 168 may be configured to perform system-wide monitoring routines such as, for example, differential protection of the transmission line using information from each end of the transmission line.

As discussed briefly above, each of the IEDs may include a number of logical nodes within each physical device. For example, IED 158 may include a logical node associated with a current of bus 108, a logical node for voltage of bus 108 obtained using, for example, a PT 134, a logical node for current of the transmission line 110, and so forth. Information associated with the logical nodes may be used in the monitoring routines of IED 158 and communicated to other IEDs such as IED 168.

IED 168 may be in further communication with certain monitoring systems such as a wide-area control and situational awareness (WCSA) system 180, SCADA system 182, and the like. IED 168 may be in communication with an information services (IS) system 184. IED 168 may obtain a common time signal from common time source 188 such as, for example, a global navigational satellite system (GNSS) or the like. IED 168 may distribute common time to other IEDs using the time signal from the common time source 188. IED 186 may include or be in communication with a local human-machine interface (HMI) 186.

Certain of the IEDs may be physically located in the same substation. For example, the generator 102, circuit breaker 104, transformer 106, and bus 108 may be co-located at a single site, and IEDs 152, 156, and 158 may be housed in a single substation. Whereas other of the IEDs may be located at different sites and different substations.

Although the IEDs as illustrated are in direct communication with primary equipment, in various embodiments, IEDs may obtain information from primary equipment using a sampling device such as, for example, a merging unit. Specifically, a merging unit may be in communication with the primary equipment to obtain signals therefrom, and provide the information from those signals (such as digitized signals) to one or more IEDs. For example, a merging unit may be in communication with CT 124 for receiving the secondary current signal from CT 124, sample the secondary current signal, digitize the secondary current signal, and communicate the digitized signal to subscribing IEDs.

As discussed herein, the monitoring routines performed by the various IEDs facilitate automation or protection functions. The monitoring routines may include, for example, differential protection, distance protection, overcurrent detection, power metering, phase comparison, undervoltage protection, bus protection, generator protection, and the like.

As discussed above, IEDs or the system of IEDs may include an active mode under which the IEDs receive information from the primary equipment, perform monitoring routines using the information, and effect an operation on the primary equipment based on an outcome of the monitoring routines. At times, the IEDs or system of IEDs may require testing, during which the communications and/or functions of the IEDs are tested, but it is not desirable to effect an operation on the primary equipment. Accordingly, the IEDs include different testing modes under which no operation on the primary equipment is effected. For example, commands from the IEDs to the primary equipment may be blocked when in a testing mode.

During the active mode, the logical nodes are assigned a behavior status of "on", the application of a function such as a monitoring routine is operative, and all communicating features are in service including, for example, effecting the operation of the primary equipment. Under certain different testing modes, some functions are restricted. For example, when the logical nodes are assigned a behavior of "on-blocked", only IEDs with direct interaction with primary equipment are effected. That is, for all other IEDs, operation is similar to the "on" behavior in that monitoring routines are operative, and all communication features are in service for intermediate IEDs. For boundary logical nodes or IEDs with outputs through contacts or analog ports to primary equipment, such outputs are blocked so that operations effecting primary equipment are not performed.

For logical nodes with the behavior of "test", the monitoring routines and communications are operative, but the information is indicated with the quality of "test", such that testing does not impact other functions in normal operation.

The outputs when in "test" mode may be blocked when the logical node behavior is in "test/blocked" condition. In this way, certain operations may be blocked. For example, output operations may be blocked when information marked with the testing indicator are used in determining the output operations. This is similar to the "on-blocked" behavior.

For logical nodes with the behavior of "off", the monitoring routines or functions are not enabled. Communications may be provided with the quality of "invalid". Control commands from a client are rejected with negative responses.

Disclosed herein are various embodiments of monitoring devices capable of reconfiguration between various active and testing modes with a single command, which is used by the configuration logical device of the monitoring device to reconfigure each subject logical node to correspond with the selected active or testing mode.

Figure 2:
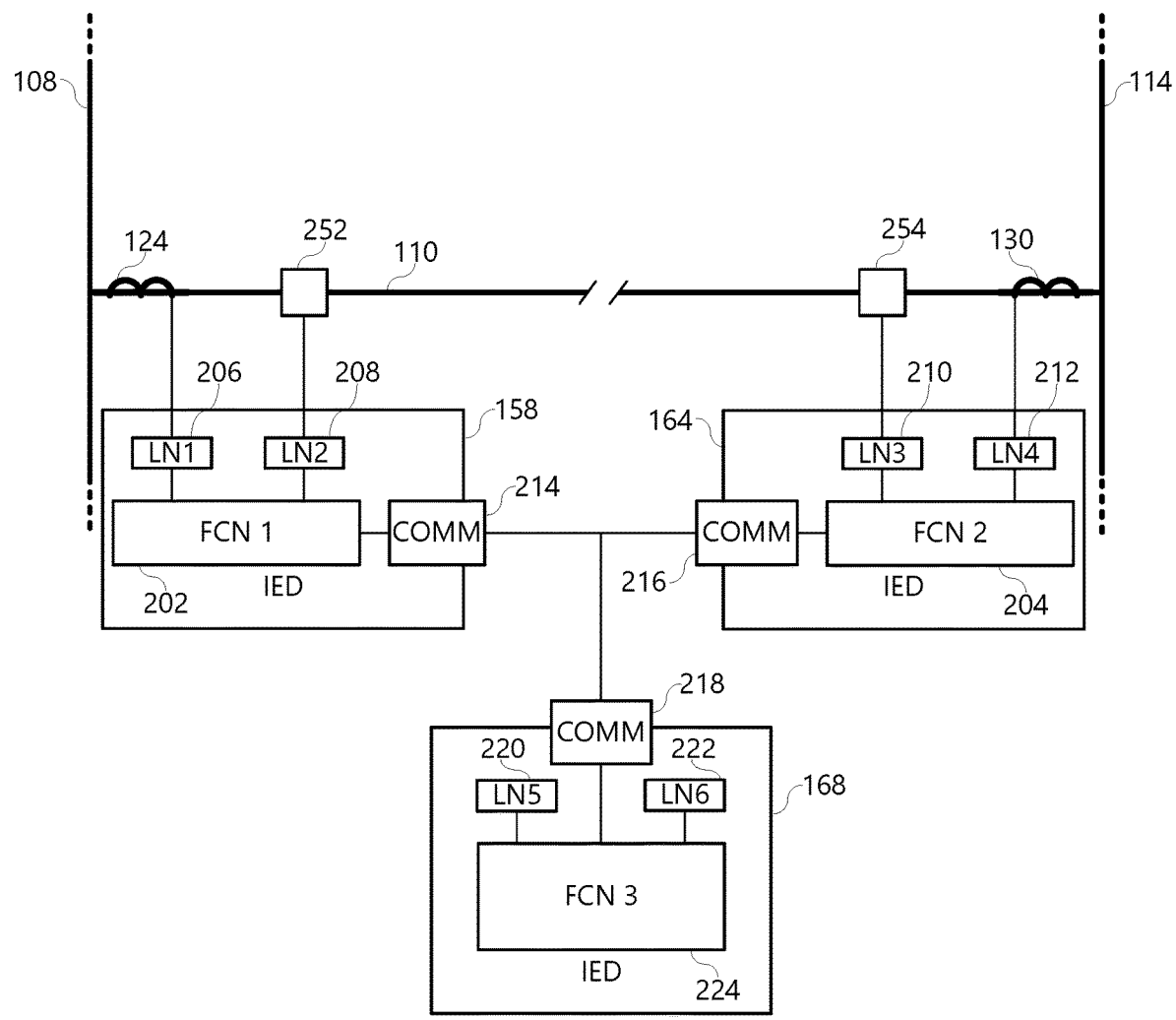
FIG. 2 is a simplified one-line diagram of an electric power delivery system including simplified block diagrams of monitoring devices in accordance with embodiments herein.

FIG. 2 illustrates a simplified one-line diagram of an electric power delivery system, and simplified block diagrams of several IEDs configured to monitor the electric power delivery system. As illustrated, IED 158 obtains information from the electric power delivery system using CT 124 and circuit breaker 252. IED 164 obtains information from the electric power delivery system using CT 130 and circuit breaker 254. IED 168 obtains information from IEDs 158 and 164. Each of the IEDs include several logical nodes (LN) and functions. IED 158 includes LN1 206 that includes current values from CT 124. LN2 208 includes position information of circuit breaker 252. LN4 212 of IED 164 includes current values from CT 130. LN3 210 includes position information of circuit breaker 254. Further, IED 158 includes a function FCN1 202 that uses LN1 206 and LN2 208 to perform a monitoring routine, and outputs communications and/or commands such as communications to be shared using communications port 214, and a command to circuit breaker 252. For example, the function FCN1 202 may be a distance protection function that may use the current values from LN1 206 and the circuit breaker position from LN2 208 to perform the monitoring routine of detecting a fault condition, determining a distance to the fault, and, depending on the fault condition and distance to the fault, may determine that the circuit breaker 252 should be opened. The function 202 may output a command to the circuit breaker 252 to open, thus effecting an operation on the electric power delivery system.

Similarly, IED 164 includes a function FCN2 204 that uses LN3 210 and LN4 212 to perform a monitoring routine, and outputs communications and/or commands such as communications to be shared using communications port 216, and a command to circuit breaker 254. For example, the function FCN2 204 may be a distance protection function that may use the current values from LN4 212 and the circuit breaker position from LN3 210 to perform the monitoring routine of detecting a fault condition, determining a distance to the fault, and, depending on the fault condition and distance to the fault, may determine that the circuit breaker 254 should be opened. The function 204 may output a command to the circuit breaker 254 to open, thus effecting an operation on the electric power delivery system.

Further, the IEDs 158 and 164 may share logical node information using communication ports 214 and 216. Communication may be direct peer-to-peer, network communication, or the like. In several embodiments, the communication may comply with the IEC-61850 protocol. Communications may be Generic Object-Oriented Substation Event (GOOSE) communications. The logical node values, positions, quality, modes, and the like may be shared. In certain embodiments, the functions (e.g. FCN 1 202 and/or FCN 2 204) of IEDs 158 and 164 may include line differential functions that use information from logical nodes on each end of the line such as, for example, currents from LN1 206 and LN4 212. If the differential function indicates a fault between IEDs 158 and 164, then the IEDs may operate one or both of circuit breakers 252 and 254. In such an embodiment, the differential functions of each IED may rely upon communications from the other IED to supply the LN information needed for the differential function, and may further rely on communications to allow or block opening of circuit breakers 252, 254 depending on the outcome of the function blocks.

As illustrated a third IED 168 is in communication with IEDs 158 and 164 using communication port 218. IED 168 includes LN5 220 and LN6 222 that may include information used by the function block FCN3 224, which may also use information from LN1, LN2, LN3, and/or LN4. Function block FCN3 224 may perform monitoring routines related to wide-area monitoring or protection of the electric power delivery system.

Upon commissioning, IEDs 158, 164, and 168 may perform various power system monitoring functions such as automation, protection, or metering. The power system monitoring functions may operate in the function blocks of the various IEDs, which perform the monitoring routines, and output results and commands. The various function blocks may use information from the various logical nodes, available to subscribing IEDs via the communication system. The results and commands may be shared among the IEDs using the communication system. Operations on the electric power delivery system may be effected by signals to the primary equipment from the IEDs. For example, if a result of one of the monitoring routines is an open command, the open command may be communicated to the IED in communication with the breaker to open, and the IED may signal the breaker to open, thus opening the breaker and effecting the topology change on the electric power delivery system.

As mentioned above, the system and IEDs may need to be tested from time to time. For example, at commissioning, the IEDs and the system may need to be tested. Upon replacement of one or more devices, the IEDs and system may need to be tested. The IEDs and system may need to be tested for auditing purposes. When under test, it is desirable that the IEDs not effect operations on the electric power delivery system. During testing conditions, test signals may be input to the IEDs using test inputs or the same inputs that the IEDs use to obtain information from the primary equipment.

In order to not effect an operation on the electric power delivery system, the IEDs may be placed into a testing mode. The testing mode may change a behavior of the IEDs as described above. Various modes may be selected such as, for example, ON, ON-BLOCKED, TEST, TEST/BLOCKED, and OFF. Change between nodes may be effected by changing the behavior of each of the subject logical nodes.

Figure 3:
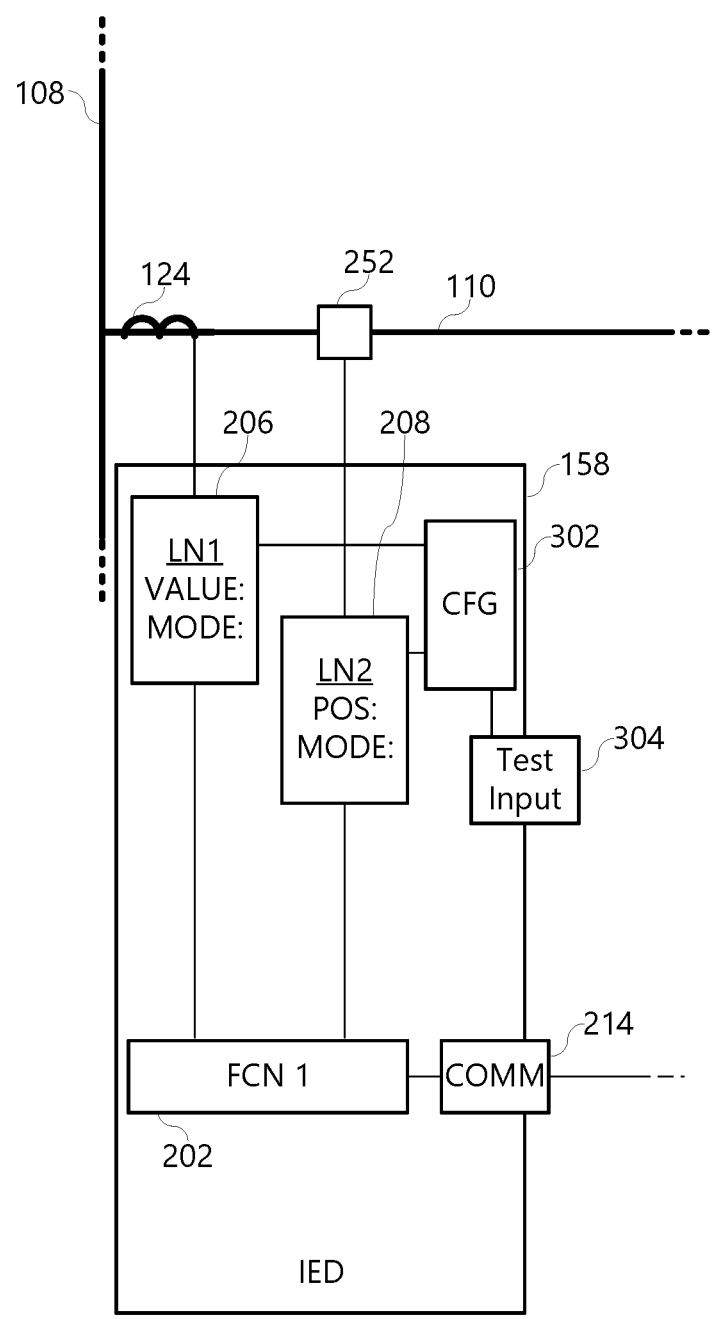
FIG. 3 is a simplified block diagram of a monitoring device according to several embodiments herein.

FIG. 3 illustrates a simplified block diagram of an IED 158 configured to change between active and testing modes using a single point on the IED. Using the single point, the behavior of all subject logical nodes may be changed with a single input, instead of undertaking a study of information flow among logical nodes, or use of the system configuration description (SCD) file to reconfigure to a testing mode. According to several embodiments herein, the testing mode selection input 304 is configured to signal the configuration module 302 to update the behavior of each of the logical nodes. The IED may include an input to accept user commands such as, for example, an HMI, a connection port (e.g. USB, RJ45, serial, or the like). Using such an input, a user may provide a command to change modes between active and testing modes. For example, the user may update a single data object in the LPHD logical node under a CFG logical device using the Manufacturing Message Specification (MMS) protocol. The point may be operated using the HMI, a connected device, or the like. When a valid mode state (e.g., ON, ON-BLOCKED, TEST, TEST/BLOCKED, OFF) is written to this single point, the configuration module 302 is configured to update the behavior of each of the logical nodes accordingly.

As illustrated, LN1 206 includes at least two objects, namely, VALUE and MODE. The VALUE object may be data obtained from the CT 124. The MODE object may be the behavior mode of the logical node. The MODE object may be updated by the configuration module 302 with the valid mode indicated by testing mode selection input 304 (e.g., ON, ON-BLOCKED, TEST, TEST/BLOCKED, OFF). Similarly, LN2 208 includes at least two objects, namely, POS and MODE. The POS object may be data obtained from the circuit breaker 252, namely, the position (open or closed). The MODE object may be the behavior mode of the logical node. The MODE object may be updated by the configuration module 302 with the valid mode indicated by testing mode selection input 304 (e.g., ON, ON-BLOCKED, TEST, TEST/BLOCKED, OFF). Accordingly, using a single point, IED 158 is configured to update the behavior of each of the logical nodes, where the single point comprises a logical input.

In certain embodiments, the testing mode selection input 304 may be a physical pushbutton, rocker switch, toggle switch, touchscreen button, or the like. Upon activation of the testing mode selection input 304, a mode selection signal may be sent to the configuration module 302, which proceeds to update the behavior of the logical nodes as described above. The testing mode selection input 304 may include an indicator such as an LED that indicates selection of the testing mode such that users have positive feedback that the behaviors of the logical nodes have been updated. Accordingly, the behavior of the logical nodes may be modified among various active and testing modes upon a single input.

Figure 4:
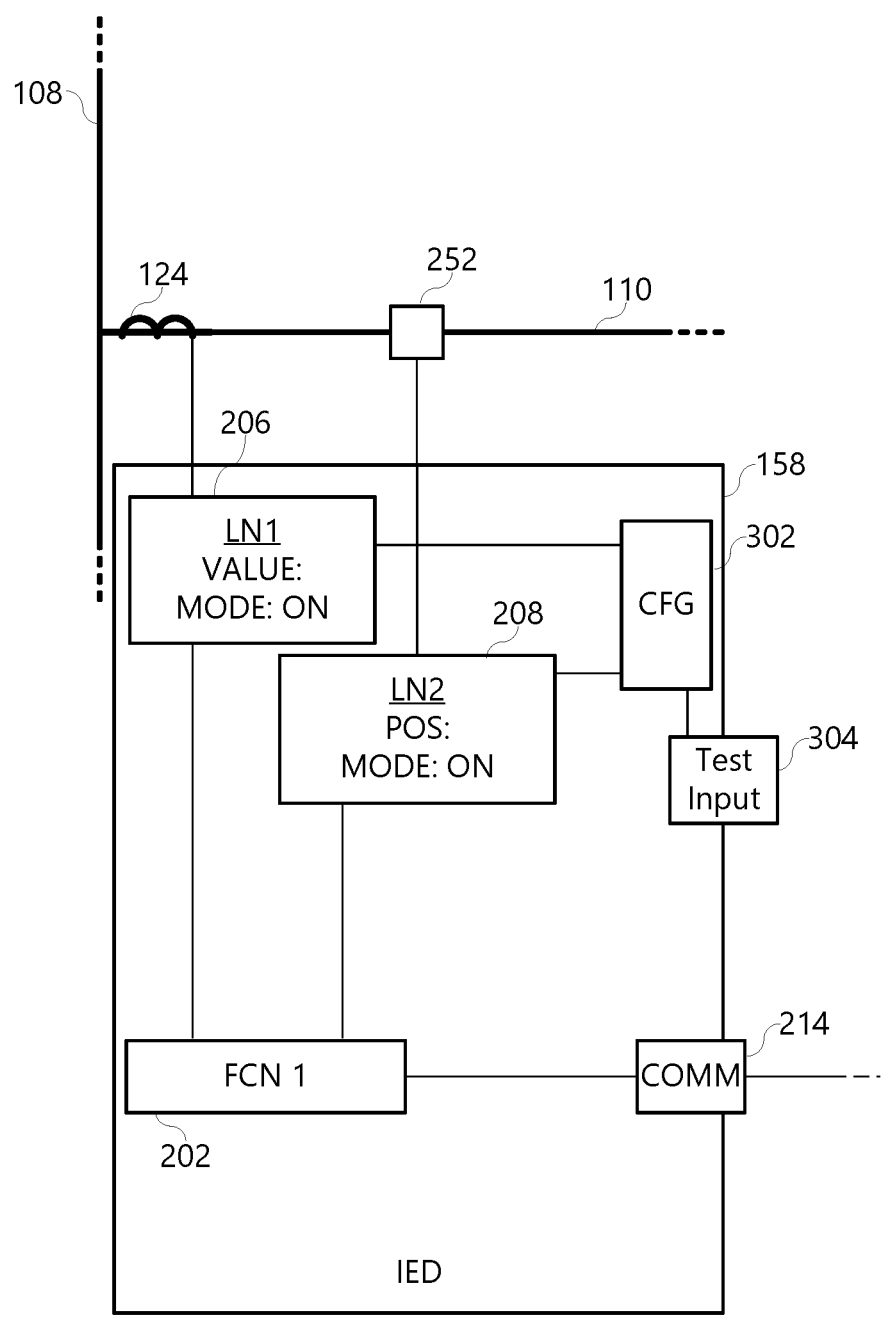
FIG. 4 is a simplified block diagram of a monitoring device with testing configuration according to several embodiments herein.
Figure 5:
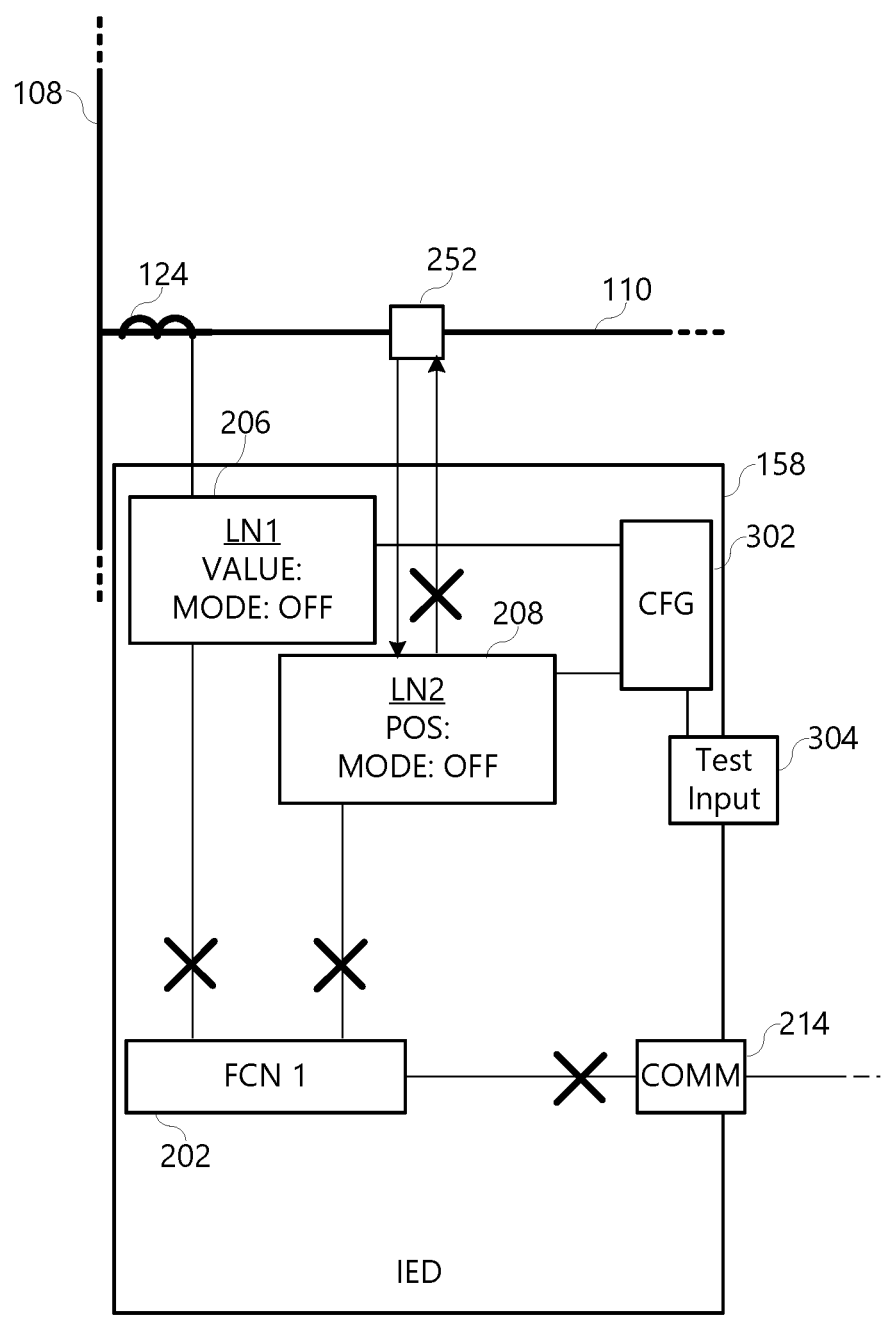
FIG. 5 is a simplified block diagram of a monitoring device with testing configuration according to several embodiments herein.
Figure 6:
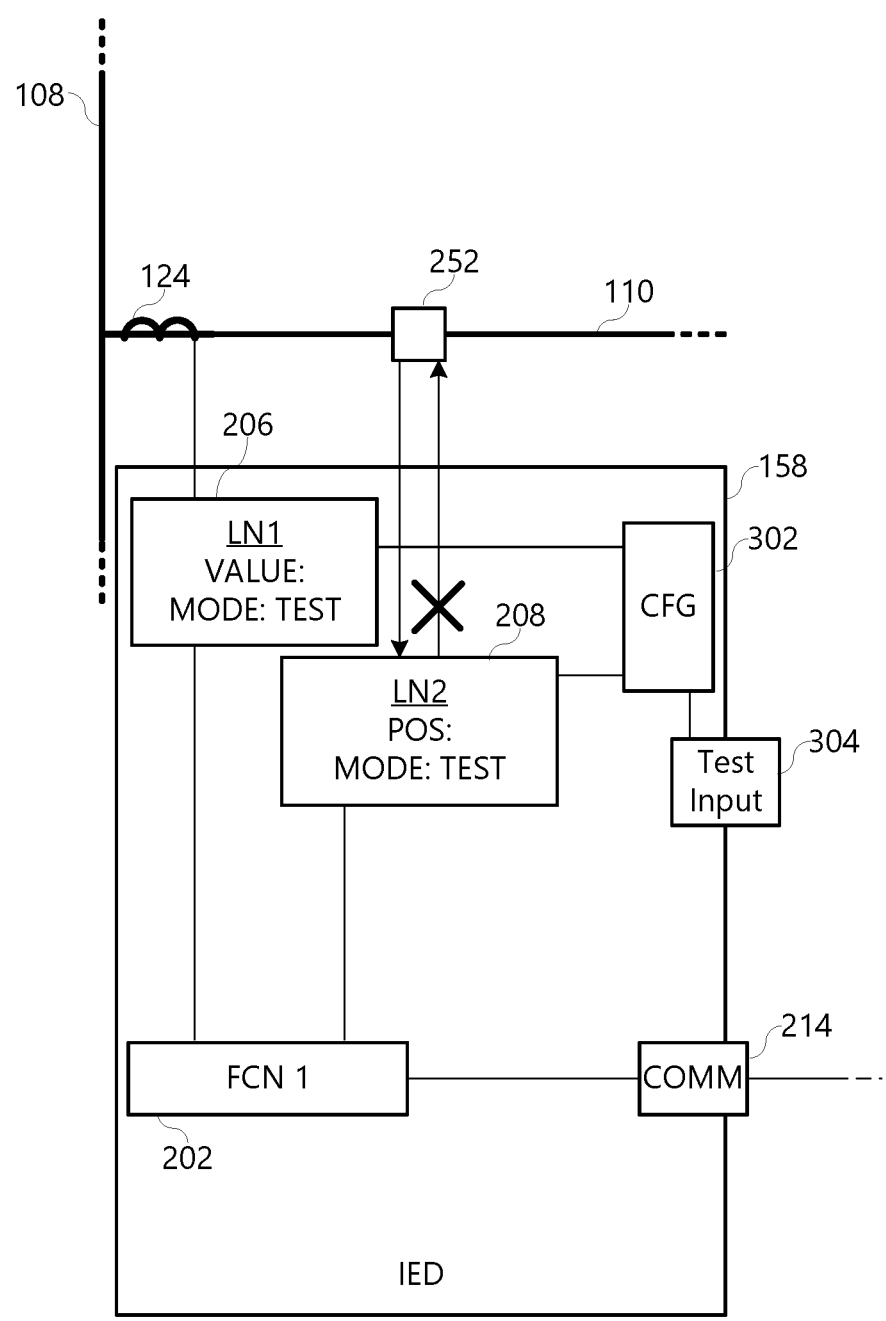
FIG. 6 is a simplified block diagram of a monitoring device with testing configuration according to several embodiments herein.

FIGS. 4, 5, and 6 illustrate the changing behavior of the IED 158 upon the single input. Specifically, FIG. 4 illustrates a simplified block diagram of the IED 158 operating in ON mode, as can be seen by the MODE objects of the logical nodes LN1 206 and LN2 208. As illustrated in FIG. 5, upon input of a valid testing mode change command to OFF using testing mode selection input 304, the configuration module 302 changes the behavior of logical nodes LN1 206 and LN2 208 to OFF. Logical nodes LN1 206 and LN2 208 may then be configured to provide information to function block FCN 1 202 with the behavior indication of OFF such that FCN 1 202 either does not receive or does not use the information. In other embodiments, information from logical nodes in the OFF behavior mode is not available to any function. In certain embodiments, with the logical nodes in OFF behavior mode, commands to the circuit breaker 252 cannot be made. Thus, operations on the electric power delivery system cannot be effected when the logical nodes are in OFF behavior mode.

Similarly, FIG. 6 illustrates a simplified block diagram of IED 158 upon input of a valid testing mode change command to TEST using testing mode selection input 304. The configuration module 302 changes the behavior of logical nodes LN1 206 and LN2 208 to TEST. Logical nodes LN1 206 and LN2 208 may then be configured to provide information to function block FCN 1 202 with the behavior indication of TEST such that FCN 1 202 can use the information in the monitoring routines, and provide an output. The output may be used in the testing of the IED 158 or the system. That is, an output of the IED 158 may be the result of the function defined in FCN 1 202. The output may be communicated to a testing device using the communication module 214. In various embodiments, the command is sent to the logical node LN2, which does not send the command to the circuit breaker due to the testing mode indication. In other embodiments, the command may be sent to a peripheral IED, but the peripheral IED does not send the command to the physical equipment due to the testing mode indication.

Furthermore, when an IED is in a testing mode, the IED may be configured to append an indication on communications therefrom related to the testing mode. For example, information from logical nodes and results of monitoring routines may be communicated with a data quality bit set to indicate that the information should not be used to effect an operation on the electric power delivery system. In certain embodiments, the IED may be configured to include the quality indicator on all communications such that all communications may include an indicator of the behavior mode of the IED.

In various embodiments, the IED may include multiple testing mode inputs. For example, the IED may be configured to accept a mode using a physical input such as a pushbutton, and to accept a mode using a logical input. In order to avoid conflicts of mode selection, the IED may be configured to supersede the mode from one input with the mode from another input. In one specific embodiment, the IED is configured to accept the mode selected using the physical input over the mode selected by a logical input. This may increase security in that the user selecting a mode change must be physically present with the IED in order to effect the mode change. In another embodiment, the IED is configured to accept the mode selected using the logical input over the mode selected by a physical input.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may not include long-distance transmission of high-voltage power. Moreover, principles described herein may also be utilized for protecting an electric system from over-frequency conditions, wherein power generation would be shed rather than load to reduce effects on the system. Accordingly, many changes may be made to the details of the above-described embodiments without departing from the underlying principles of this disclosure. The scope of the present invention should, therefore, be determined only by the following claims.

What is claimed is:

1. A configurable monitoring device of an electric power delivery system substation, the device comprising:
    an input for receiving electric power delivery system information;
    a first mode under which the device is configured to monitor an electric power delivery system by obtaining electric power delivery system information, performing a monitoring routine, and effecting a monitoring operation on the electric power delivery system;
    a second mode under which the device is configured to perform restricted operations due to a modified behavior of logical nodes of the device;
    an output for communicating results of the monitoring routine; and,
    a mode selection input configured to specify one of the first mode and the second mode by updating each subject logical node of a plurality of logical nodes of the device with the specified mode upon receipt of instructions to change to the specified mode;
    wherein the second mode comprises a testing mode under which the restricted operations include receipt of test electric power delivery system information, performing a monitoring routine, and communicating results of the monitoring routine, without effecting a monitoring operation on the electric power delivery system.

2. The configurable monitoring device of claim 1, wherein the mode selection input comprises a physical input of the configurable monitoring device.

3. The configurable monitoring device of claim 2, wherein the physical input comprises a button.

4. The configurable monitoring device of claim 2, wherein the physical input comprises a toggle switch.

5. The configurable monitoring device of claim 1, wherein the mode selection input comprises a logical input.

6. The configurable monitoring device of claim 1, wherein the mode selection input is further configured to update a single point of a manufacturing message specification (MMS).

7. The configurable monitoring device of claim 6, further configured to update each subject node of the plurality of logical nodes upon a valid update of the single point of the MMS by the mode selection input.

8. The configurable monitoring device of claim 1, wherein the first mode comprises an active mode under which the behavior of the subject logical nodes is set to "on".

9. The configurable monitoring device of claim 1, wherein the test electric power delivery system information comprises signals from a testing unit.

10. The configurable monitoring device of claim 1, wherein the test electric power delivery system information comprises signals from the electric power delivery system.

11. The configurable monitoring device of claim 1, wherein the mode selection input comprises a physical input and a logical input, wherein the configurable monitoring device is configured to override a mode selected by one of the physical input and the logical input with the mode selected by the other of the physical input and the logical input.

12. A system for monitoring an electric power delivery system, comprising:
    a first configurable monitoring device in communication with the electric power delivery system to receive electrical information from the electric power delivery system and provide a command to effect an operational change to the electric power delivery system, the first configurable monitoring device including:
        a plurality of logical nodes, each comprising an object related to electric power delivery system information and an operating mode object of the logical node;
        a testing mode selection input configured to receive a testing mode selection by input of the testing mode selection and to provide a signal to change logical node behavior;
        a configuration module in communication with the testing mode selection input, configured to update the testing mode by modifying the operating mode object of each logical node of the plurality of logical nodes according to the testing mode selection from the testing mode selection input; and
        a function module comprising a monitoring routine using the electric power delivery system information from the logical node and provide an output of the monitoring routine to effect an operation on the electric power delivery system when the behavior of the logical nodes is not a test behavior.

13. The system of claim 12, wherein the testing mode selection input comprises a logical input.

14. The system of claim 12, wherein the testing mode selection input comprises a pushbutton.

15. The system of claim 12, wherein the testing mode selection input comprises a toggle switch.

16. The system of claim 12, wherein the system further comprises a second configurable monitoring device in communication with the first configurable monitoring device, comprising a second function module comprising a monitoring routine using the electric power delivery system information from the first configurable monitoring device, and provide an output of the monitoring routine to effect an operation on the electric power delivery system when the behavior of the logical nodes is not a test behavior.

17. The system of claim 16, wherein the second function module is configured to not effect the operation of the electric power delivery system when the behavior of the logical nodes is a test behavior.

18. The system of claim 16, wherein the test behavior comprises one selected from the group consisting of ON-BLOCKED, TEST, TEST/BLOCKED, and OFF.

19. The system of claim 12, wherein the testing mode selection input comprises a logical input and a physical input, wherein the configurable monitoring device is configured to override a mode selected by one of the physical input and the logical input with the mode selected by the other of the physical input and the logical input.

20. A configurable monitoring device of an electric power delivery system substation, the device comprising:

an input for receiving electric power delivery system information;

a first mode under which the device is configured to monitor an electric power delivery system by obtaining electric power delivery system information, performing a monitoring routine, and effecting a monitoring operation on the electric power delivery system;

a second mode under which the device is configured to perform restricted operations due to a modified behavior of logical nodes of the device;

an output for communicating results of the monitoring routine; and, a mode selection input configured to specify one of the first mode and the second mode by updating each subject logical node of a plurality of logical nodes of the device with the specified mode upon receipt of instructions to change to the specified mode;

wherein the mode selection input comprises a physical input and a logical input, wherein the configurable monitoring device is configured to override a mode selected by one of the physical input and the logical input with the mode selected by the other of the physical input and the logical input.

* * * * *